(12) United States Patent
Kawaguchi et al.

(10) Patent No.: US 11,777,447 B2
(45) Date of Patent: Oct. 3, 2023

(54) OSCILLATION CIRCUIT AND INFORMATION PROCESSING DEVICE

(71) Applicant: FUJITSU LIMITED, Kawasaki (JP)

(72) Inventors: Kenichi Kawaguchi, Ebina (JP); Shoichi Miyahara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/959,918

(22) Filed: Oct. 4, 2022

(65) Prior Publication Data

US 2023/0021543 A1 Jan. 26, 2023

Related U.S. Application Data

(63) Continuation of application No. PCT/JP2020/019654, filed on May 18, 2020.

(51) Int. Cl.
*H03B 7/08* (2006.01)
*G06N 3/063* (2023.01)
*G06N 3/06* (2006.01)
*G06G 7/60* (2006.01)
(Continued)

(52) U.S. Cl.
CPC ............. *H03B 7/08* (2013.01); *G06G 7/60* (2013.01); *G06N 3/06* (2013.01); *G06N 3/063* (2013.01); *H03L 7/099* (2013.01); *H04B 1/16* (2013.01)

(58) Field of Classification Search
CPC . H03B 7/08; H04B 1/16; G06N 3/063; G06G 7/60; H03L 7/099
USPC ...... 331/107 T, 2; 455/226.2, 215, 214, 336; 332/141, 138
See application file for complete search history.

(56) References Cited

U.S. PATENT DOCUMENTS

| 3,225,317 A | 12/1965 | Yasuda et al. |
| 5,014,018 A | 5/1991 | Rodwell et al. |
| 2005/0146386 A1 | 7/2005 | Frazier |

(Continued)

FOREIGN PATENT DOCUMENTS

| JP | H01-272201 A | 10/1989 |
| JP | 2005-018500 | 1/2005 |

(Continued)

OTHER PUBLICATIONS

International Search Report and Written Opinion of the International Searching Authority (Form PCT/ISA/210, 220, and 237), mailed in connection with PCT/JP2020/019654 and dated Jul. 21, 2020 (Total 10 pages).

(Continued)

*Primary Examiner* — Arnold M Kinkead
(74) *Attorney, Agent, or Firm* — Fujitsu Patent Center

(57) ABSTRACT

An oscillation circuit according to the present invention includes a first oscillation circuit including a first diode having a first negative differential resistance and first composite inductor having a first inductor and a second inductor connected in series to the first diode in series. The oscillation circuit also includes a second diode that has a second negative differential resistance that is connected to the first inductor in parallel, and a third diode having a third negative differential resistance is connected to the third diode in series and is also connected to the first composite inductor in parallel. A burst pulse is output from a common connection point of the first inductor, the second inductor, and the second diode.

12 Claims, 23 Drawing Sheets

(51) Int. Cl.
*H04B 1/16* (2006.01)
*H03L 7/099* (2006.01)

(56) References Cited

U.S. PATENT DOCUMENTS

2012/0068778 A1* 3/2012 Sekiguchi ............... H03B 7/02
    331/132
2014/0098845 A1  4/2014 Egard et al.

FOREIGN PATENT DOCUMENTS

| JP | 2005-333227   | 12/2005 |
| JP | 2014-517620 A |  7/2014 |
| WO | 2012/163403 A1| 12/2012 |

OTHER PUBLICATIONS

D'Iachenko, B M: "Multistage Oscillator Using Tunnel Diodes", Electronic Express, vol. 9, No. 2, Jan. 31, 1967, pp. 15-16, XP001461455.
Extended European Search Report dated Jun. 21, 2023 for corresponding European Patent Application No. 20936713.5, 7 pages.

* cited by examiner

OSCILLATION CIRCUIT AND INFORMATION PROCESSING DEVICE

CROSS-REFERENCE TO RELATED APPLICATION

This application is a continuation application of International Application PCT/JP2020/019654 filed on May 18, 2020 and designated the U.S., the entire contents of which are incorporated herein by reference.

FIELD

The present invention relates to an oscillation circuit and an information processing device.

BACKGROUND

In recent years, in order to provide advanced artificial intelligence (AI) services, development in computing systems for the AI has been advanced. Among them, neuromorphic (neuromorphic) computing inspired by brain neural signal processing has attracted attention.

Deep learning based AIs use a simplified model of brain neurons and their association circuits (analog neurons). On the other hand, neuromorphic uses a model that mimics neurons that output spiking pulses or the like (spike neurons or the like), and this enables intelligent information processing that more closely mimics the brain mechanism.

Furthermore, in neuromorphic computing, a computing system is constructed using an oscillation circuit that oscillates neuron-like pulses that mimic neural signal pulses as a signal source unit.

As a technique related to the oscillation circuit, for example, a technique has been proposed that connects two N-type negative resistance elements in series and connects a resonance circuit including an inductor and a capacitor to a connection unit of the two N-type negative resistance elements so as to prevent spurious oscillation.

Furthermore, a technique has been proposed that sets a connection point of the two negative differential resistance elements as an output extraction point, applies a vibrating-type voltage to a power supply side terminal of one negative differential resistance element, and uses a binary output determined based on a thermal noise added to the negative differential resistance element as a natural random number.
Patent Document 1: Japanese Laid-open Patent Publication No. 2005-333227, Patent Document 2: Japanese Laid-open Patent Publication No. 2005-018500.

SUMMARY

According to an aspect of the embodiments, an oscillation circuit includes a first oscillation circuit that includes: a first diode that has a first negative differential resistance; a first composite inductor in which a first inductor and a second inductor are connected in series, is connected to the first diode in series; a second diode that has a second negative differential resistance and is connected to the first inductor in parallel; and a third diode that has a third negative differential resistance, is connected to the first diode in series, and is connected to the first composite inductor in parallel, wherein a burst pulse is output from a common connection point of the first inductor, the second inductor, and the second diode.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In order to assume the pulse signal as the neuron-like pulse, it is required to oscillate burst pulses of which pulse intervals, the number of pulses, or the like are variously changed. However, a former circuit that oscillates the burst pulse has a problem in that the circuit has a large number of components and a circuit size increases.

In one aspect, an object of the present invention is to provide an oscillation circuit that enables to reduce a circuit size of a circuit that oscillates a burst pulse and an information processing device that includes the oscillation circuit.

According to one aspect, it is possible to reduce a circuit size.

The above-described object and other objects, features, and advantages of the present invention will become clear from the following description related to the accompanying drawings, which illustrate favorable embodiments as examples of the present invention.

Hereinafter, the present embodiment will be described with reference to the drawings.

First Embodiment

Figure 1:
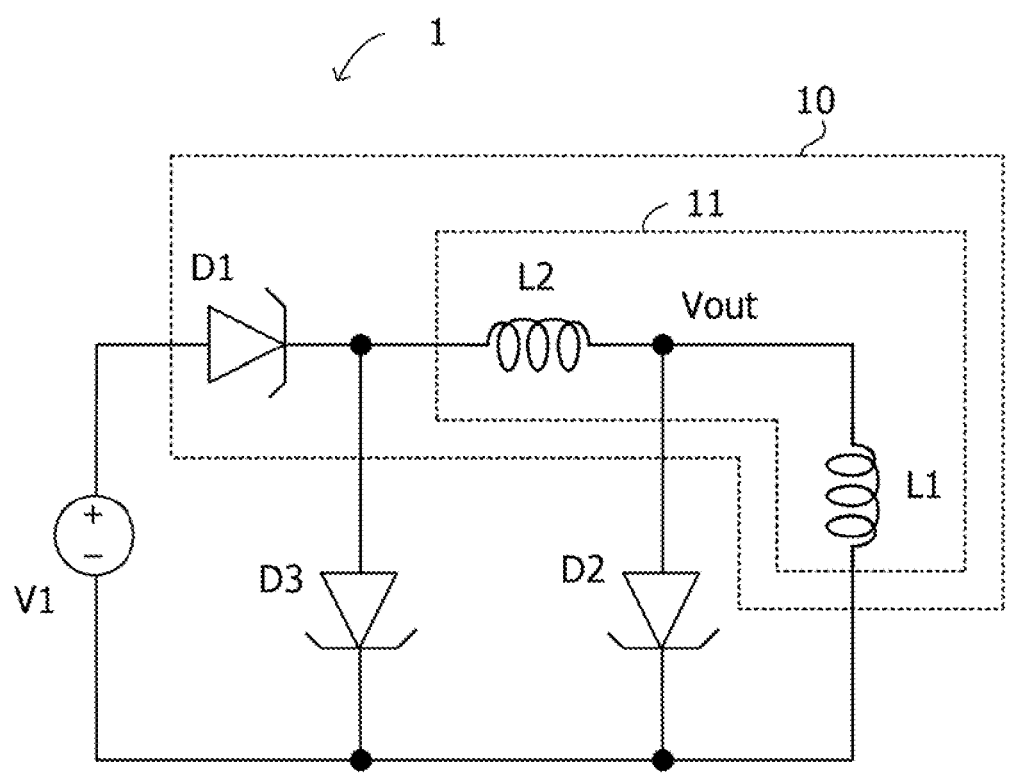
FIG. 1 is a diagram illustrating an example of an oscillation circuit according to a first embodiment.

FIG. 1 is a diagram illustrating an example of an oscillation circuit according to a first embodiment. An oscillation circuit 1 includes a diode D1 (first diode), a diode D2 (second diode), a diode D3 (third diode), an inductor L1 (first inductor), an inductor L2 (second inductor), and a power supply unit V1 (direct current (DC) DC power supply).

The diodes D1 to D3 are non-linear passive elements having negative differential resistances, and for example, an Esaki diode or a resonance tunnel diode is used.

In the oscillation circuit 1, the diode D1 having a first negative differential resistance and a composite inductor 11 are connected in series to form an oscillation unit 10. In the composite inductor 11, the inductors L1 and L2 are connected in series.

In addition, in the oscillation circuit 1, the diode D2 having a second negative differential resistance is connected to the inductor L1 in parallel. Furthermore, the diode D3 having a third negative differential resistance is connected to the diode D1 in series and is connected to the composite inductor 11 in parallel. An output end of the oscillation circuit 1 is a common connection point (Vout) of the inductors L1 and L2 and the diode D2, and a burst pulse (neuron-like pulse) is output from the common connection point (Vout).

In a connection relationship of the components, a positive-side terminal of the power supply unit V1 is connected to an anode of the diode D1, and a cathode of the diode D1 is connected to an anode of the diode D3 and one end of the inductor L2.

Another end of the inductor L2 is connected to an anode of the diode D2 and one end of the inductor L1. A negative-side terminal of the power supply unit V1 is connected to another end of the inductor L1, a cathode of the diode D2, and a cathode of the diode D3.

Figure 2:
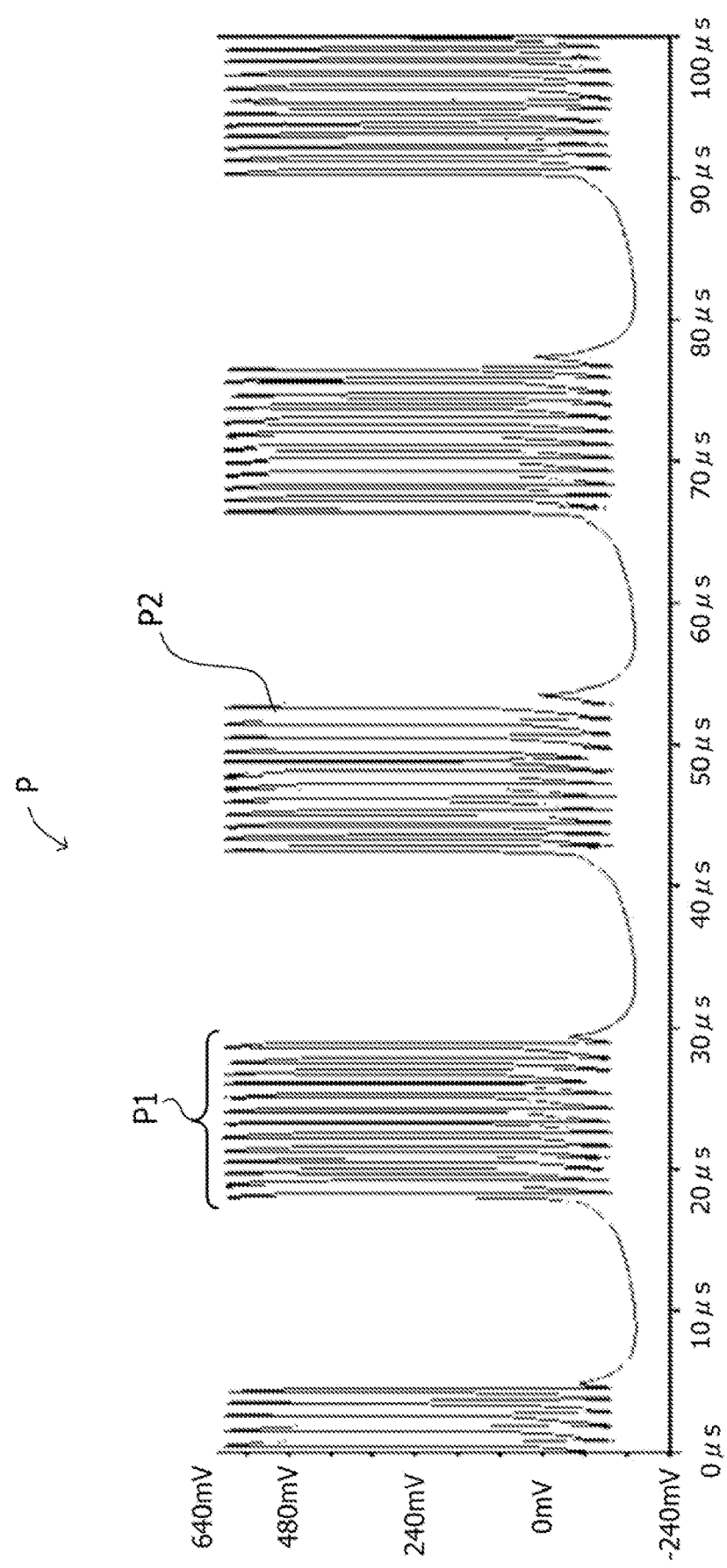
FIG. 2 is a diagram illustrating an example of a burst pulse.

FIG. 2 is a diagram illustrating an example of the burst pulse. The vertical axis indicates a voltage (mV), the horizontal axis indicates time (μs). A burst pulse P as illustrated in FIG. 2 is oscillated from the output end (common connection point) Vout of the oscillation circuit 1 illustrated in FIG. 1. The burst pulse P includes intermittent pulses P1 and short pulses P2 included in the intermittent pulse P1.

In this way, the oscillation circuit 1 oscillates the burst pulse using the components including the diodes D1 to D3 that are non-linear elements having the negative differential resistances and the inductors L1 and L2, with an application of a DC voltage. As a result, because it is possible to oscillate the burst pulse with a small number of components, it is possible to reduce a circuit size.

<Negative Differential Resistance>

Next, the negative differential resistance will be described. Note that, hereinafter, a diode having a negative differential resistance may be referred to as a tunnel diode. Therefore, the diodes D1 to D3 may be referred to as tunnel diodes D1 to D3, respectively.

The tunnel diode has characteristics that a concentration of impurities doped in a p-type and an n-type layers is higher than a concentration of impurities of a pn-junction diode and a transistor having normal rectifying characteristics.

Figure 3:
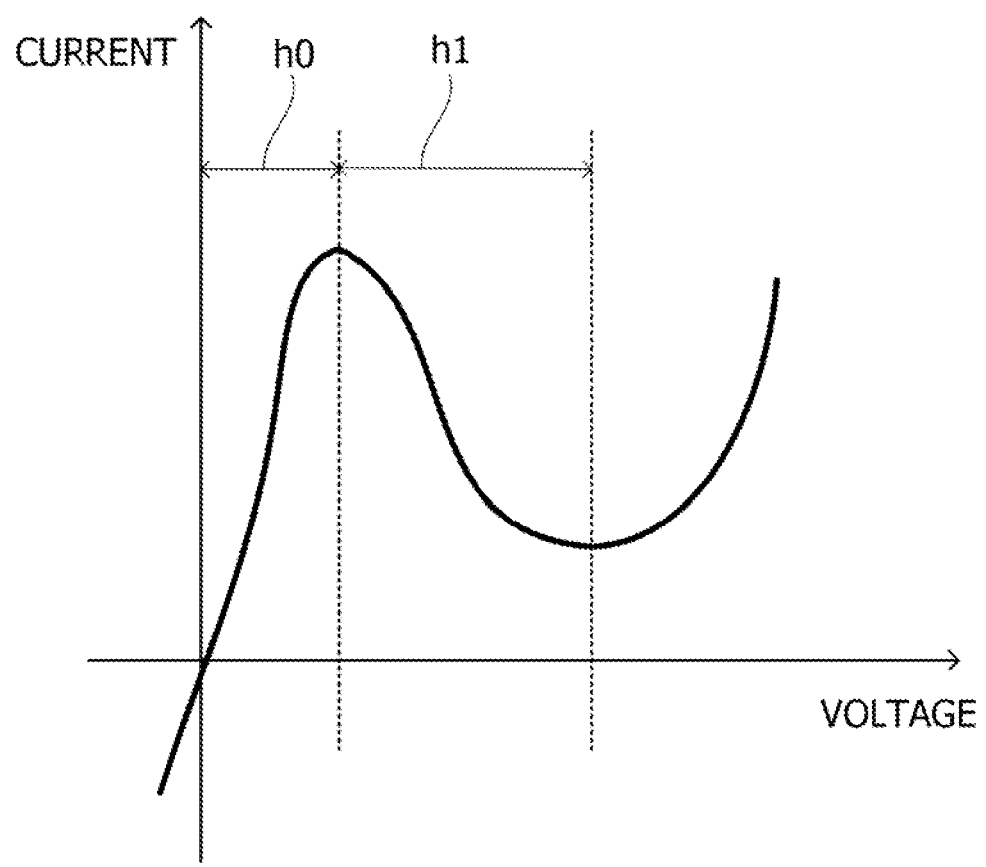
FIG. 3 is a diagram for explaining a negative differential resistance.

FIG. 3 is a diagram for explaining the negative differential resistance. high-impurity-concentration pn-junction current-voltage characteristics (forward characteristics) are illustrated, the vertical axis indicates a current, and the horizontal axis indicates a voltage. In a general pn-junction diode, when a forward bias is applied (positive voltage is applied to p side, and negative voltage is applied to n side), a current increases with a voltage equal to or higher than a forward junction voltage.

In contrast, in a high-impurity-concentration pn-junction tunnel diode, when the forward bias is applied, a tunnel effect (phenomenon in which electrons pass through potential barrier created in depletion layer) is caused in a voltage range h0, and a current increases. Furthermore, when the forward bias is further increased, the tunnel effect is reduced in a voltage range hi, and characteristics that the current decreases as the voltage increases (negative differential resistance region) appear.

Since such characteristics correspond to that a differential resistance that is a ratio of a voltage increment and a current increment becomes negative, the characteristics are called a negative differential resistance (negative resistance) as a resistance component having a negative value. Furthermore, a slope of a characteristic curve in the negative differential resistance region can be expressed as a differential coefficient of the negative differential resistance.

By using such a voltage range (negative differential resistance region) in which the current decreases as the voltage increases for the tunnel diode, for example, a self-excited high-frequency oscillation circuit can be realized.

<Minimum Components of Oscillation Circuit>

Next, it will be described that the components included in the oscillation circuit 1 illustrated in FIG. 1 are the minimum components (basic unit) used to oscillate a burst pulse, with reference to FIGS. 4 to 9.

Figure 4:
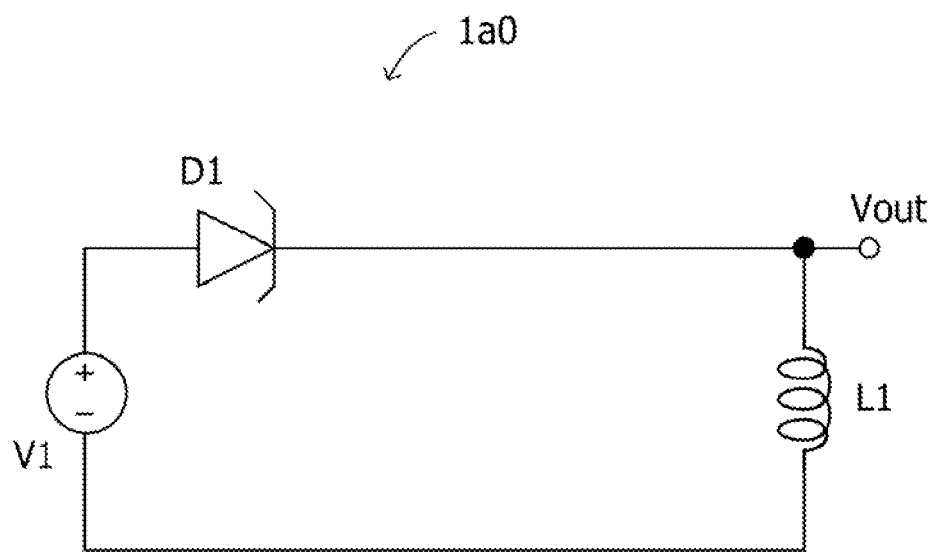
FIG. 4 is a diagram illustrating an example of an oscillation circuit.

FIG. 4 is a diagram illustrating an example of the oscillation circuit. An oscillation circuit 1a0 includes the tunnel diode D1, the inductor L1, and the power supply unit V1. A positive-side terminal of the power supply unit V1 is connected to an anode of the tunnel diode D1, and a cathode of the tunnel diode D1 is connected to one end of the inductor L1. A negative-side terminal of the power supply unit V1 is connected to another end of the inductor L1.

Figure 5:
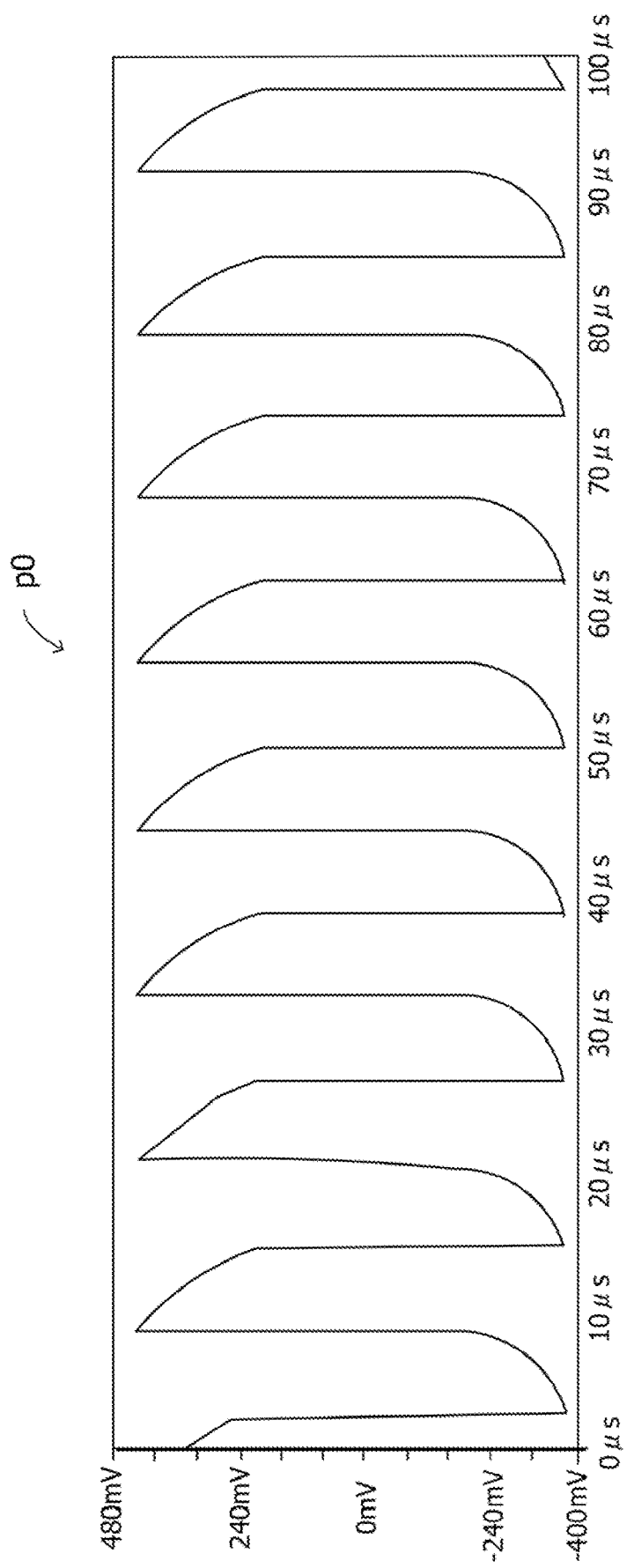
FIG. 5 is a diagram illustrating an example of an oscillation waveform.

FIG. 5 is a diagram illustrating an example of an oscillation waveform. An oscillation pulse p0 output from an output end Vout of the oscillation circuit 1a0 is illustrated. The vertical axis indicates a voltage (mV), and the horizontal axis indicates time (μs). The oscillation pulse p0 is generated by using the single tunnel diode D1 and the single inductor L1 as in the oscillation circuit 1a0.

A period of the oscillation pulse p0 is about 15 μs, and a duty ratio of the pulse is about 50%. Furthermore, the oscillation pulse p0 has a shorter repetition interval than that of the burst pulse in FIG. 2. Furthermore, due to non-linear characteristics of a current-voltage curve of the tunnel diode D1, a waveform of the oscillation pulse p0 is not a sine wave and is a waveform with sharp rising and falling.

Figure 6:
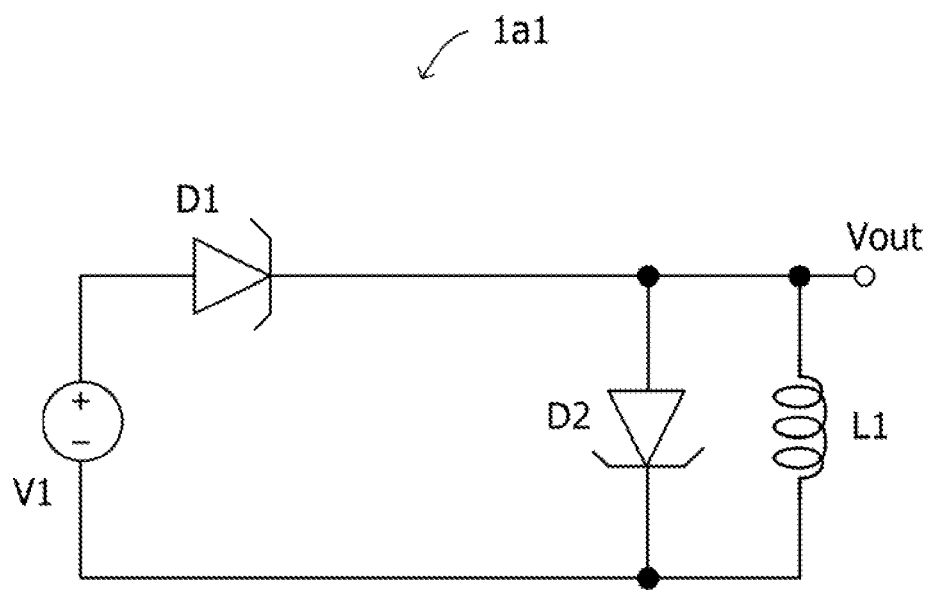
FIG. 6 is a diagram illustrating an example of the oscillation circuit.

FIG. 6 is a diagram illustrating an example of the oscillation circuit. An oscillation circuit 1a1 includes the tunnel diode D1, the tunnel diode D2, the inductor L1, and the power supply unit V1. A positive-side terminal of the power supply unit V1 is connected to an anode of the tunnel diode D1, and a cathode of the tunnel diode D1 is connected to an anode of the tunnel diode D2 and one end of the inductor L1. A negative-side terminal of the power supply unit V1 is connected to another end of the inductor L1 and a cathode of the tunnel diode D2.

Figure 7:
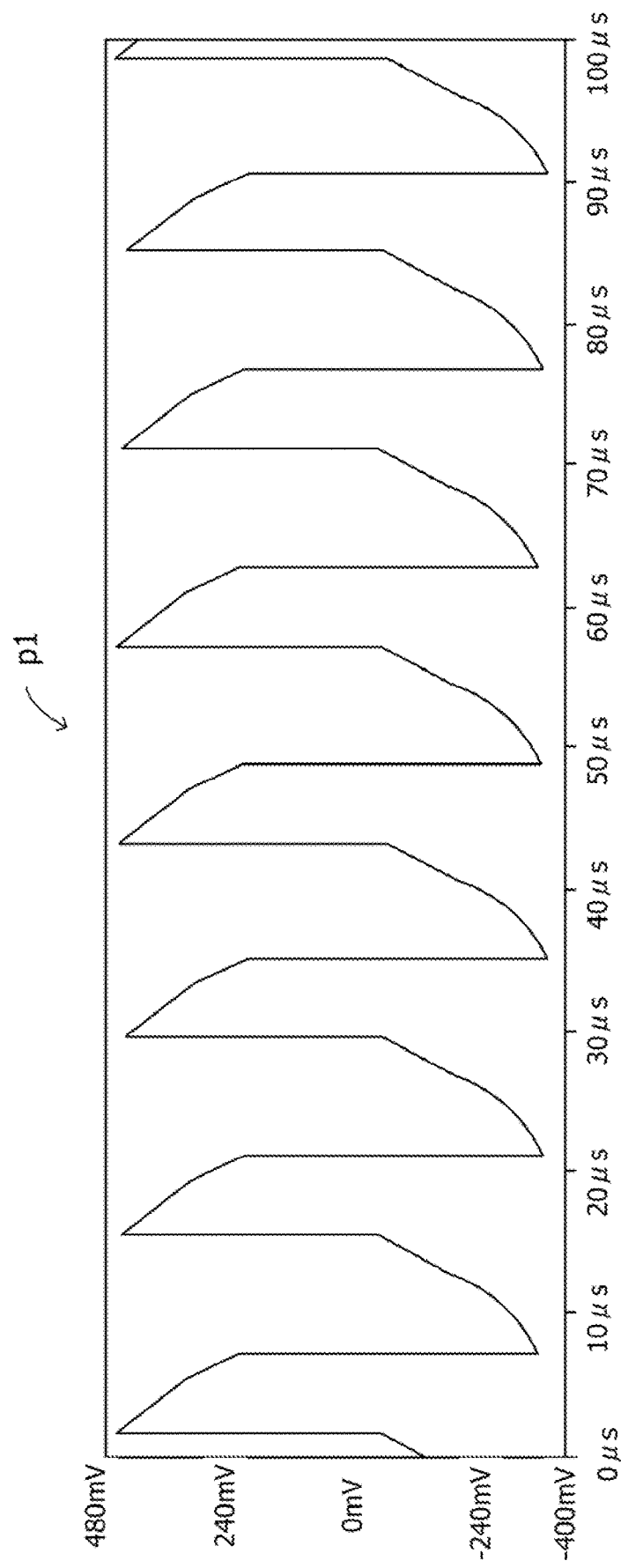
FIG. 7 is a diagram illustrating an example of the oscillation waveform.

FIG. 7 is a diagram illustrating an example of the oscillation waveform. An oscillation pulse p1 output from an output end Vout of the oscillation circuit 1a1 is illustrated. The vertical axis indicates a voltage (mV), and the horizontal axis indicates time (µs). As in the oscillation circuit 1a1, the oscillation pulse p1 is generated by connecting the tunnel diode D2 in parallel to the inductor L1 and in series with the tunnel diode D1, with respect to the oscillation circuit 1a0.

A period of the oscillation pulse p1 is approximately the same as the oscillation pulse p0, and a duty ratio of the pulse is asymmetrical. This can be assumed that a bypass line is added to the oscillation circuit 1a0 by the tunnel diode D2 and a negative differential resistance and non-linear characteristics of the tunnel diode D2 cause pulse width modulation.

Figure 8:
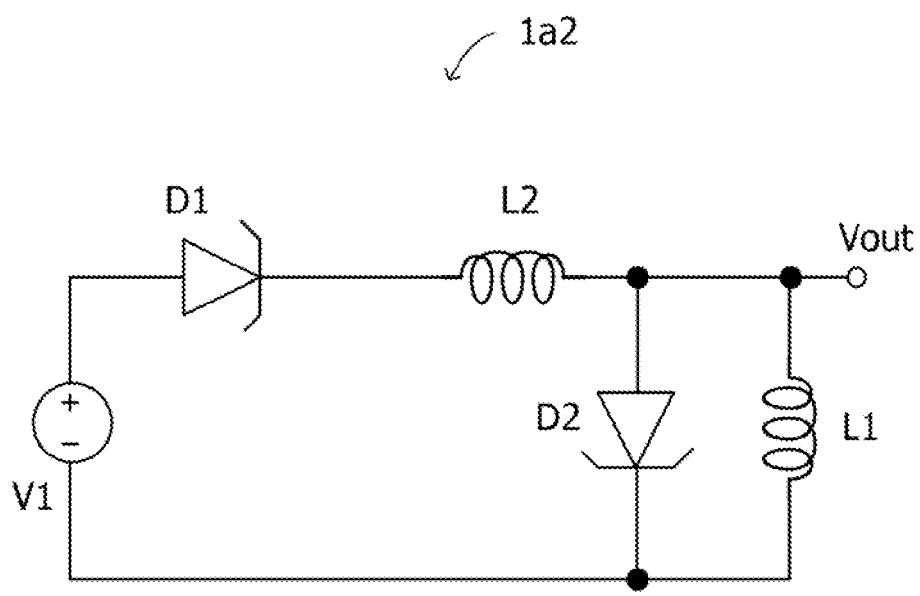
FIG. 8 is a diagram illustrating an example of the oscillation circuit.

FIG. 8 is a diagram illustrating an example of the oscillation circuit. An oscillation circuit 1a2 includes the tunnel diode D1, the tunnel diode D2, the inductor L1, the inductor L2, and the power supply unit V1. A positive-side terminal of the power supply unit V1 is connected to an anode of the tunnel diode D1, and a cathode of the tunnel diode D1 is connected to one end of the inductor L2.

Another end of the inductor L2 is connected to an anode of the tunnel diode D2 and one end of the inductor L1. A negative-side terminal of the power supply unit V1 is connected to another end of the inductor L1 and a cathode of the tunnel diode D2.

Figure 9:
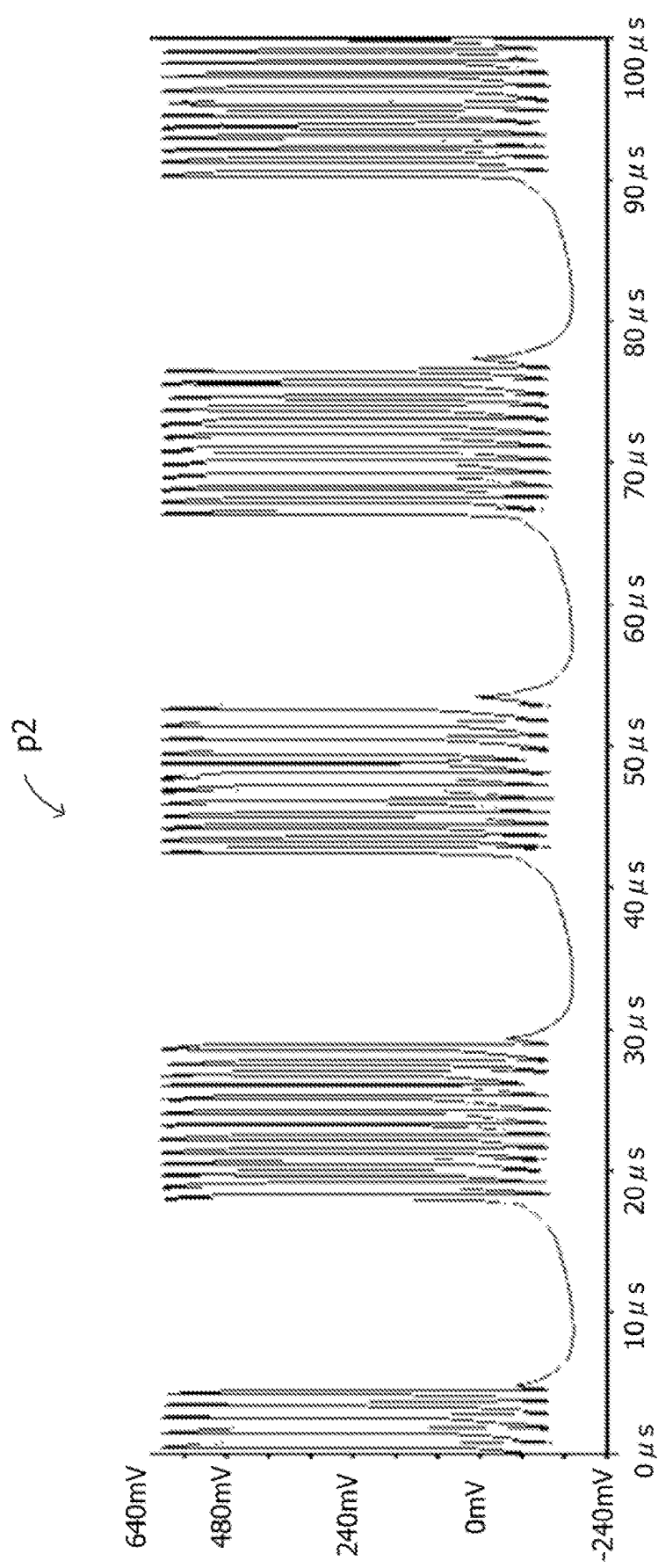
FIG. 9 is a diagram illustrating an example of the oscillation waveform.

FIG. 9 is a diagram illustrating an example of the oscillation waveform. An oscillation pulse p2 output from an output end Vout of the oscillation circuit 1a2 is illustrated. The vertical axis indicates a voltage (mV), and the horizontal axis indicates time (µs). As in the oscillation circuit 1a2, the oscillation pulse p2 is generated by inserting the inductor L2 between the cathode of the tunnel diode D1, the anode of the tunnel diode D2, and the one end of the inductor L1, with respect to the oscillation circuit 1a1. The oscillation pulse p2 has a waveform in which a short pulse train is superimposed on an intermittent pulse.

In this way, by configuring the oscillation circuit 1a2 by adding the inductor L2 to the oscillation circuit 1a1 so as to form a connection configuration illustrated in FIG. 8, it is possible to generate a burst pulse in which short pulse trains are intermittently repeated.

Furthermore, the oscillation circuit 1 as illustrated in FIG. 1 is configured by connecting the tunnel diode D3 to the tunnel diode D1 in series and to the composite inductor 11 including the inductors L1 and L2 in parallel, with respect to the oscillation circuit 1a2.

By adding the tunnel diode D3 to the oscillation circuit 1a2, a negative differential resistance and non-linear characteristics of the tunnel diode D3 enable to adjust an intermittent degree of the intermittent pulse (ratio of the number of intermittent pulses included in certain period) with respect to the oscillation pulse p2.

Note that an amplitude of the burst pulse can be changed by varying a size of the tunnel diode D1 (size of element). A diode size is proportional to an amount of a current flowing in a diode. When the size of the tunnel diode D1 increases, the amplitude of the burst pulse increases, and when the size of the tunnel diode D1 decreases, the amplitude of the burst pulse decreases.

As described above, the oscillation circuit 1 using the minimum components including the tunnel diodes D1 to D3 and the inductors L1 and L2 can oscillate the burst pulse that imitates a neural signal pulse, and it is possible to reduce the circuit size.

<Characteristics of Tunnel Diode>

Figure 10:
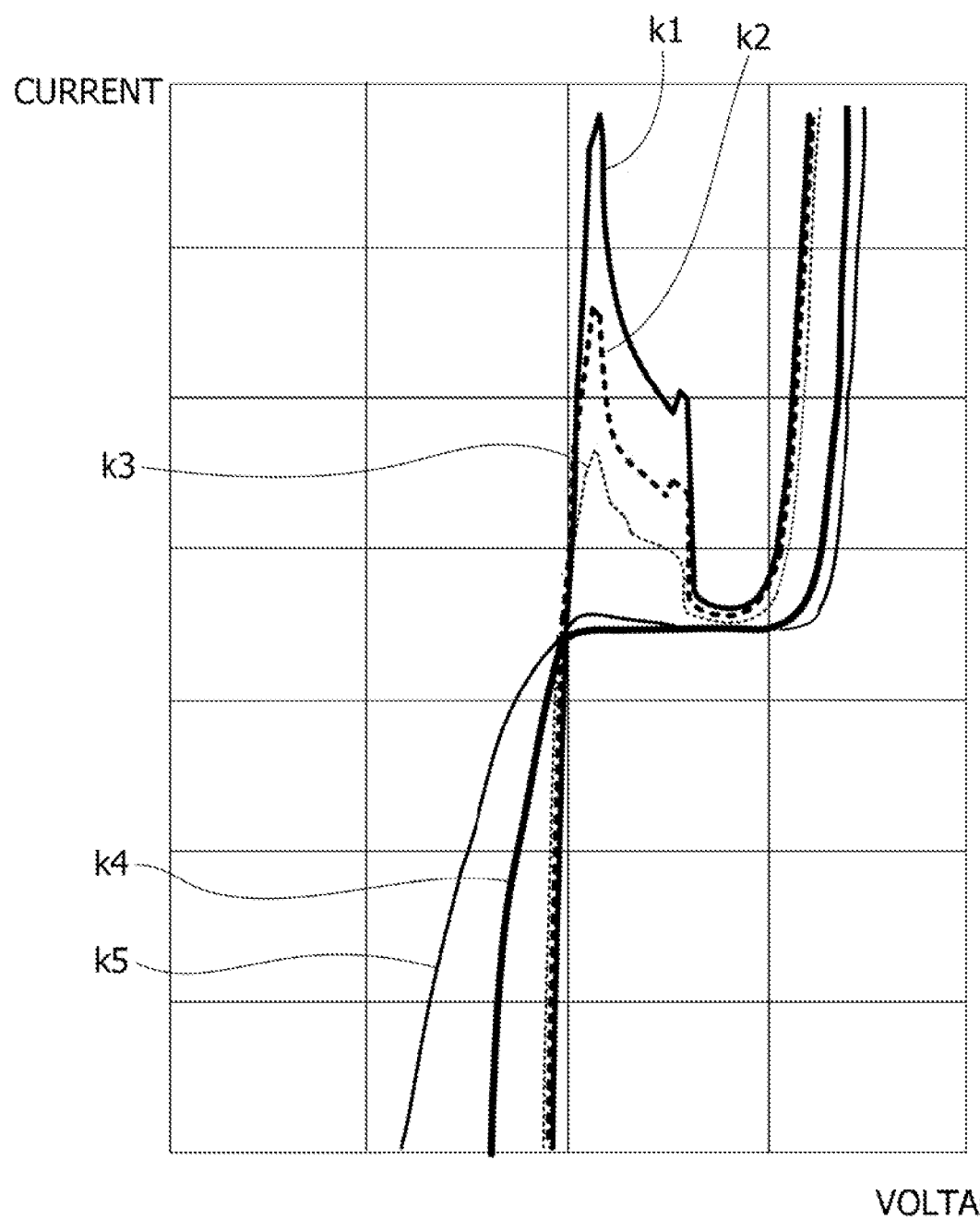
FIG. 10 is a diagram illustrating an example of characteristics of a negative differential resistance of a tunnel diode.

Next, characteristics of the tunnel diodes D1 to D3 will be described. FIG. 10 is a diagram illustrating an example of characteristics of a negative differential resistance of a tunnel diode. The vertical axis indicates a current, and the horizontal axis indicates a voltage. Characteristic curves k1 to k5 indicate characteristics of negative differential resistances of tunnel diodes.

The characteristic curve k1 indicates characteristics of a negative differential resistance of a tunnel diode with a size of 100 µm, the characteristic curve k2 indicates characteristics of a negative differential resistance of a tunnel diode with a size of 80 µm, and the characteristic curve k3 indicates characteristics of a negative differential resistance of a tunnel diode with a size of 60 µm.

Furthermore, the characteristic curve k4 indicates characteristics of a negative differential resistance of a tunnel diode with a size of 20 µm, and the characteristic curve k5 indicates characteristics of a negative differential resistance of a tunnel diode with a size of 10 µm. In this way, the current that flows differs according to the size of the tunnel diode, and the larger the size of the tunnel diode is, the larger the negative differential resistance is.

In the oscillation circuit 1, by setting the negative differential resistance of the tunnel diode D1 to have larger characteristics than the negative differential resistances of the tunnel diodes D2 and D3, the tunnel diode D1 is caused to function as an oscillation driving source of the oscillation circuit 1.

Therefore, for the tunnel diode D1, for example, the size having the characteristics of one of the characteristic curves k1 to k3 is selected. Furthermore, for the tunnel diodes D2 and D3, the size having the characteristics of one of the characteristic curves k4 and k5 is selected.

For example, the size of the tunnel diode D1 is assumed as 100 µm (characteristic curve k1), the size of the tunnel diode D2 is assumed as 20 µm (characteristic curve k4), and the size of the tunnel diode D3 is assumed as 10 µm (characteristic curve k5). Note that, as long as the negative differential resistances of the tunnel diodes D2 and D3 are smaller than the negative differential resistance of the tunnel diode D1, the negative differential resistances of the tunnel diodes D2 and D3 may be the same (sizes of tunnel diodes D2 and D3 may be the same).

By selecting the size of the tunnel diode in this way, the tunnel diode D1 can be caused to function as the oscillation driving source of the oscillation circuit 1, and in addition, the burst pulse can be stably oscillated from the tunnel diode D1 and a composite series inductor including the inductors L1 and L2.

Note that a plurality of tunnel diodes having different negative differential resistances can have the same configuration with respect to a semiconductor layer. Therefore, without performing integration from different types of wafers, it is possible to collectively configure the oscillation circuits 1 on a single wafer and, it is possible to construct an oscillation circuit group of the burst pulse.

\<Characteristics of Composite Inductor\>

Figure 11:
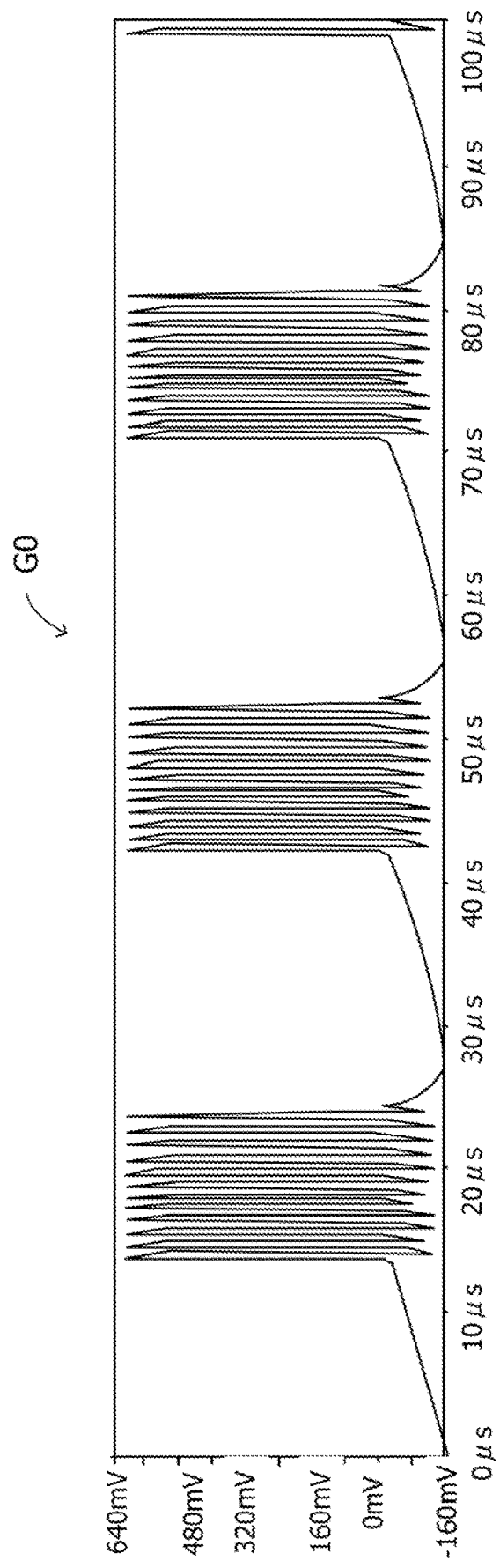
FIG. 11 is a diagram illustrating an example of a waveform of the burst pulse.
Figure 12:
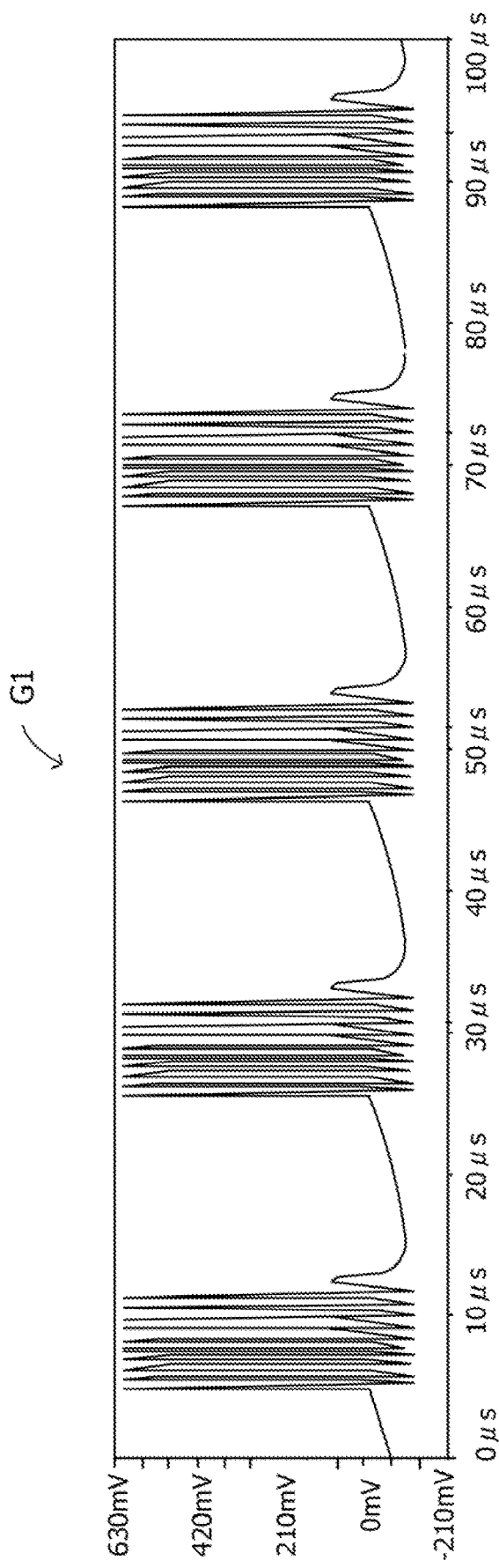
FIG. 12 is a diagram illustrating an example of the waveform of the burst pulse.
Figure 13:
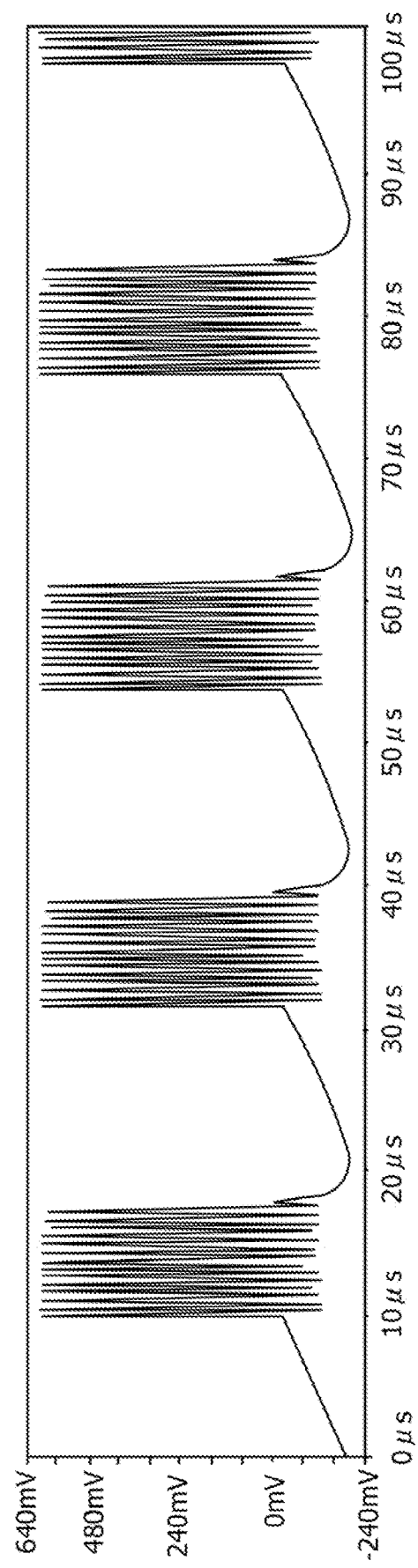
FIG. 13 is a diagram illustrating an example of the waveform of the burst pulse.

Next, characteristics of the inductors L1 and L2 included in the composite inductor 11 will be described with reference to FIGS. 11 to 13. FIGS. 11 to 13 are diagrams illustrating an example of a waveform of the burst pulse. The vertical axis indicates a voltage (mV), the horizontal axis indicates time (μs).

FIG. 11 illustrates a waveform G0 of a burst pulse when an inductance of the inductor L1 (first inductance) and an inductance of the inductor L2 (second inductance) are the same values (for example, L1=L2=100 pH).

FIG. 12 illustrates a waveform G1 of a burst pulse when the inductance of the inductor L1 is a smaller value than the inductance of the inductor L2 (for example, L1=50 pH, L2=100 pH).

By setting the inductance of the inductor L1 to be smaller than the inductance of the inductor L2, a period of an intermittent pulse can be shorter than that of the waveform G0, and the number of short pulses included in the intermittent pulse can be smaller than that of the waveform G0.

FIG. 13 illustrates a waveform G2 of a burst pulse when the inductance of the inductor L2 is a smaller value than the inductance of the inductor L1 (for example, L1=100 pH, L2=50 pH).

By setting the inductance of the inductor L2 to be smaller than the inductance of the inductor L1, a period of an intermittent pulse can be shorter than that of the waveform G0, and the number of short pulses included in the intermittent pulse can be larger than that of the waveform G0.

In this way, by changing setting of each inductance of the inductors L1 and L2, it is possible to adjust the interval of the intermittent pulse period and to increase or decrease the number of short pulses to be superimposed in the intermittent pulse. Therefore, since the intermittent pulse period and the number of short pulses can be flexibly adjusted, it is possible to oscillate a burst pulse that is suitable for desired information processing.

Second Embodiment

Next, a second embodiment will be described. In the first embodiment described above, a DC power supply is used as an input power supply. However, in a second embodiment, an alternating current (AC) power supply or a power supply that outputs a voltage obtained by superimposing the AC voltage on the DC voltage (hereinafter, referred to as DC+AC voltage) is used to oscillate various burst pulses.

Figure 14:
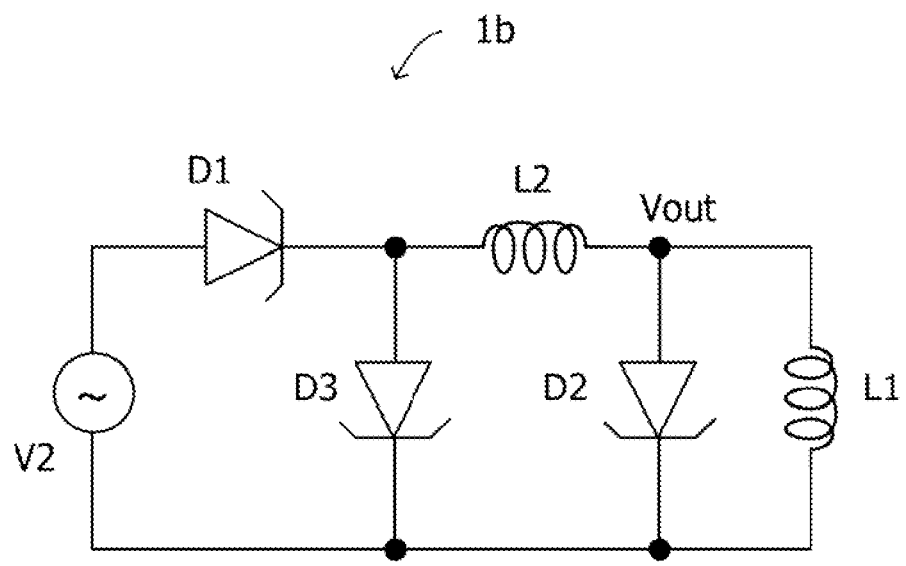
FIG. 14 is a diagram illustrating an example of an oscillation circuit according to a second embodiment.

FIG. 14 is a diagram illustrating an example of an oscillation circuit according to the second embodiment. An oscillation circuit 1b includes tunnel diodes D1 to D3, inductors L1 and L2, and a power supply unit V2. The power supply unit V2 is the AC power supply or the power supply that outputs the DC+AC voltage. Note that, since a configuration other than the power supply unit V2 is the same as that in FIG. 1, description of a circuit configuration will be omitted.

Figure 15:
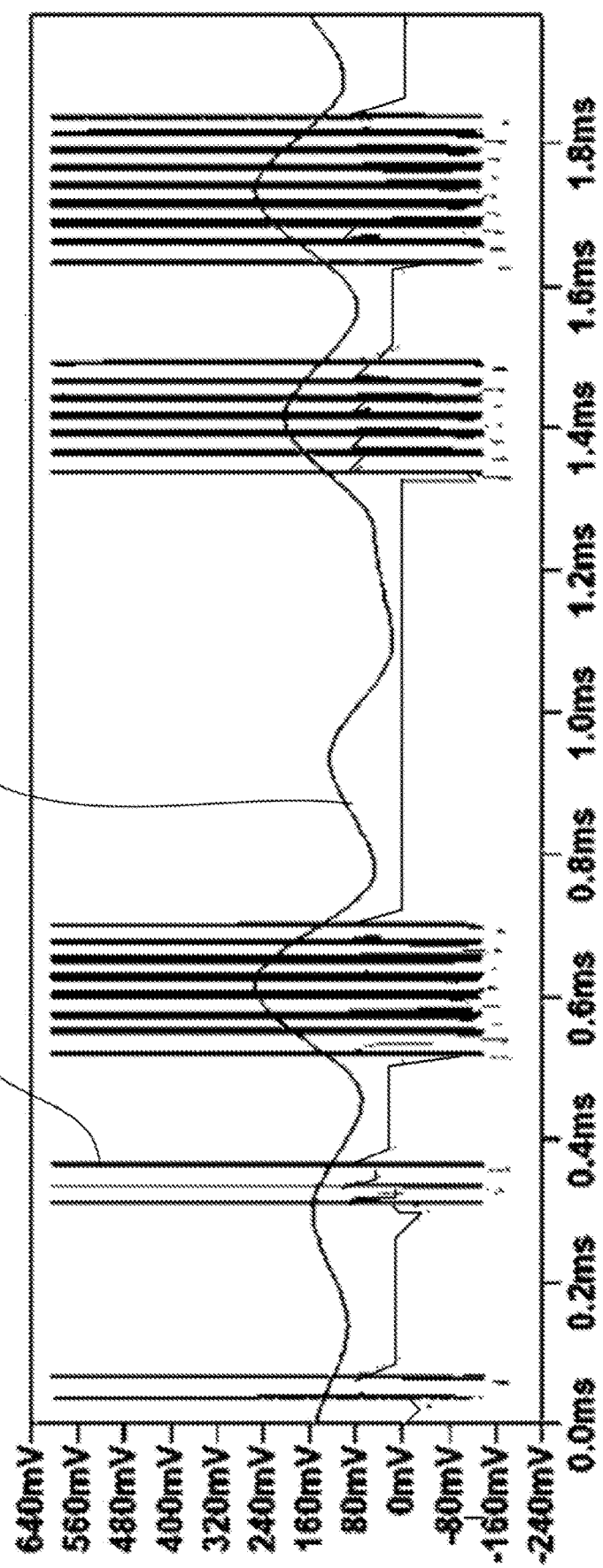
FIG. 15 is a diagram illustrating an example of a waveform of a burst pulse.

FIG. 15 is a diagram illustrating an example of a waveform of a burst pulse. The vertical axis indicates a voltage (mV), and the horizontal axis indicates time (ms). In the oscillation circuit 1b, it is assumed that the power supply unit V2 output the DC+AC voltage. A waveform g11 is a waveform of the DC+AC voltage of the power supply unit V2, and a waveform g12 indicates a waveform of a burst pulse output from an output end Vout of the oscillation circuit 1b.

By inputting a power supply voltage to which a random AC voltage is applied, in addition to the DC voltage by the power supply unit V2, the waveform of the burst pulse can be complexly changed by varying the input voltage. Note that the random AC voltage is a voltage that changes an amplitude or a frequency of an AC voltage.

Figure 16:
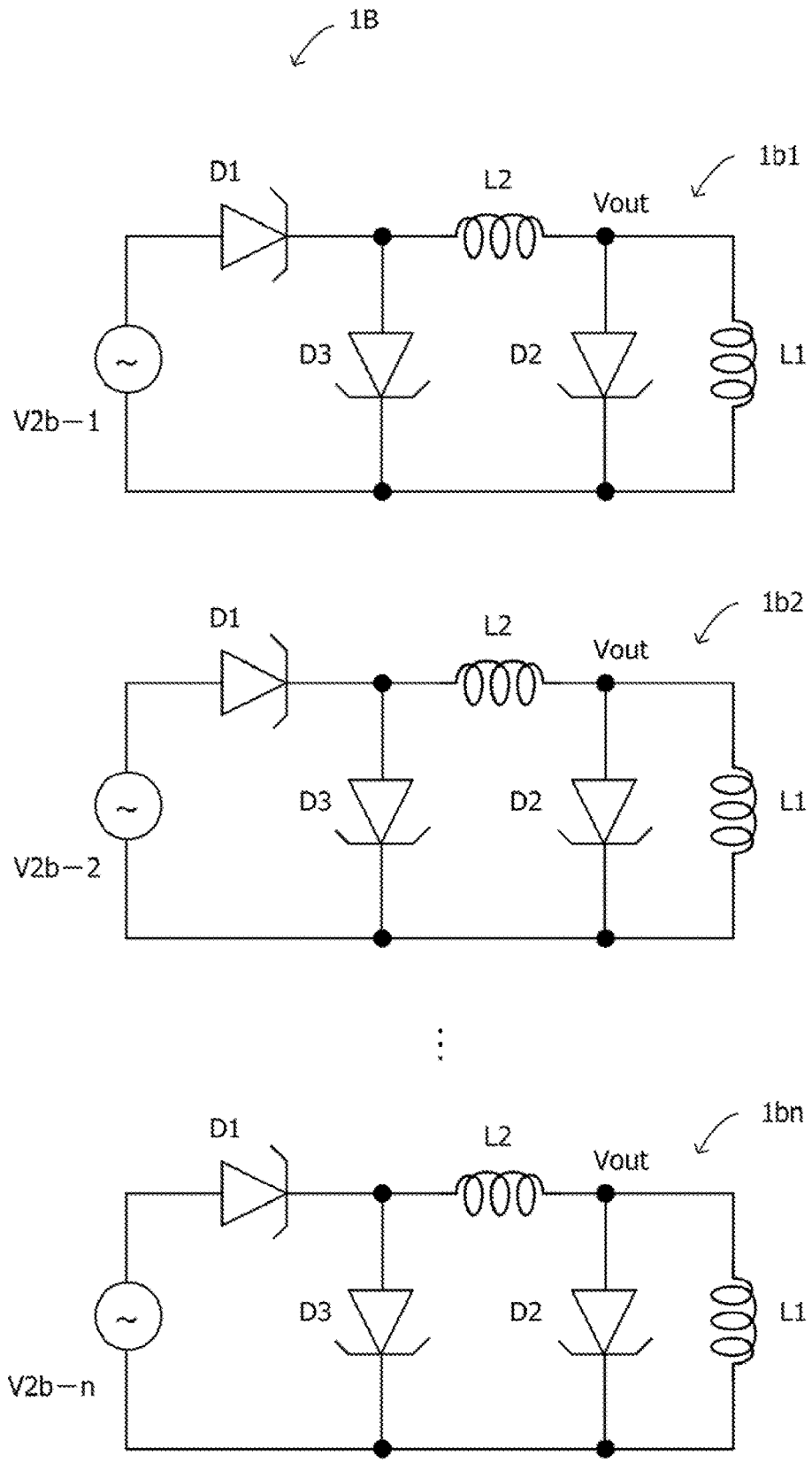
FIG. 16 is a diagram illustrating an example of an oscillation circuit group including a plurality of oscillation circuits.

FIG. 16 is a diagram illustrating an example of an oscillation circuit group including a plurality of oscillation circuits. An oscillation circuit group 1B includes oscillation circuits $1b1$, $1b2$, to $1bn$. The oscillation circuits $1b1$, $1b2$, to $1bn$ respectively include power supply units $V2b$-1, $V2b$-2, to $V2b$-$n$ that output AC voltages different from each other. Characteristics of the tunnel diodes D1 to D3 and the inductors L1 and L2 are common in the oscillation circuits $1b1$, $1b2$, to $1bn$.

The oscillation circuit group 1B with such a configuration can oscillate n burst pulses having waveforms different from each other, from output ends Vout of the oscillation circuits $1b1$, $1b2$, to $1bn$.

Figure 17:
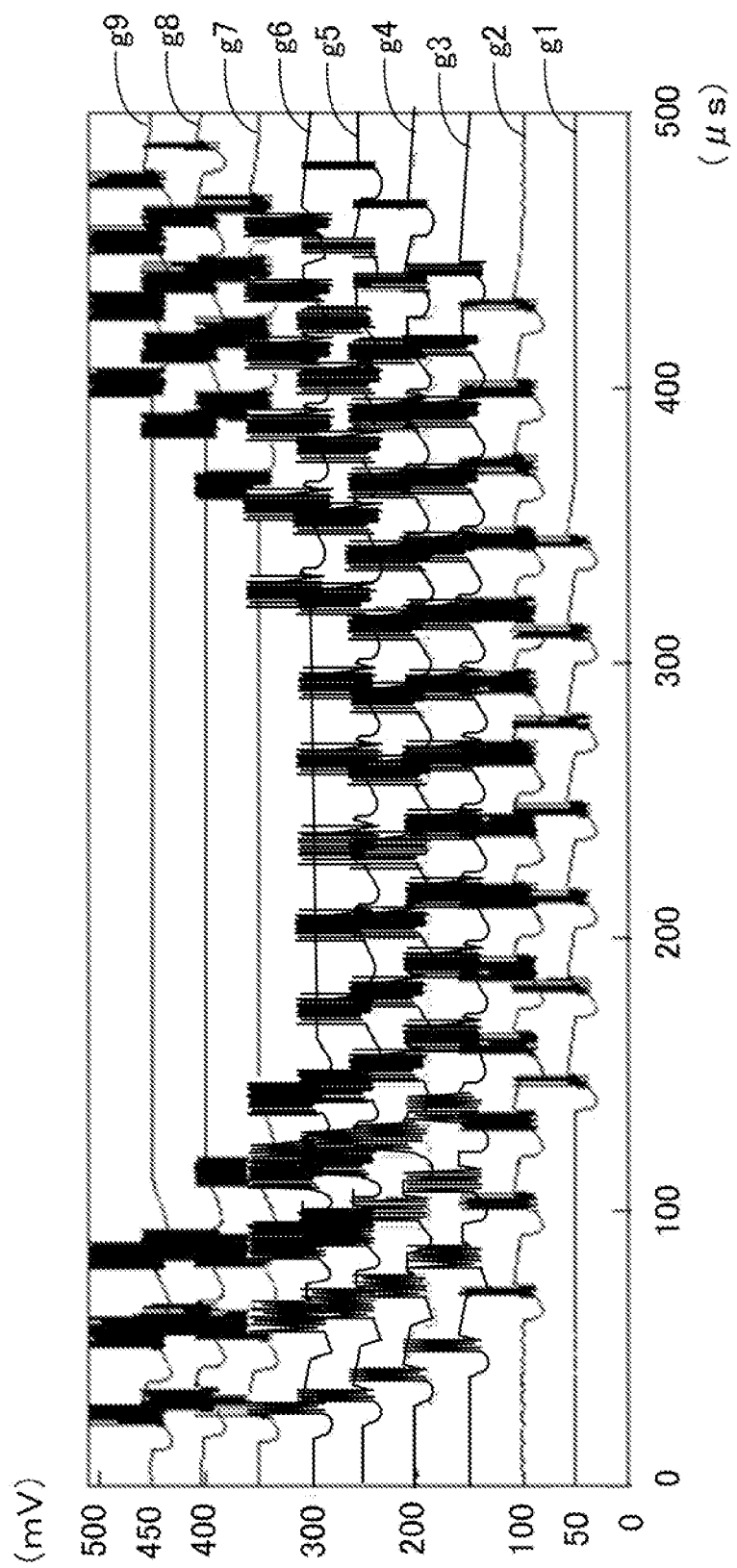
FIG. 17 is a diagram illustrating an example of the waveform of the burst pulse.

FIG. 17 is a diagram illustrating an example of a waveform of the burst pulse. The vertical axis indicates a voltage (mV), the horizontal axis indicates time (μs). Graphs g1 to g9 illustrate waveforms of burst pulses output from the output ends Vout of the respective oscillation circuits $1b1$ to $1b9$ when a certain regularity is given to a change in the AC voltage output from the power supply unit.

In the example in FIG. 17, sine wave AC voltages with amplitudes different from each other are output from power supply units $V2b$-1 to $V2b$-9. For example, a sine wave signal is changed from 500 mV to 450 mV (nine AC voltage signals) every amplitude of 50 mV.

Here, in the above, a configuration is used in which the plurality of AC power supplies that outputs AC voltages with amplitudes different from each other is provided. However, if only the amplitude of the AC voltage is changed, the power supply unit can include a single AC power supply and a plurality of resistors having resistance values different from each other.

Figure 18:
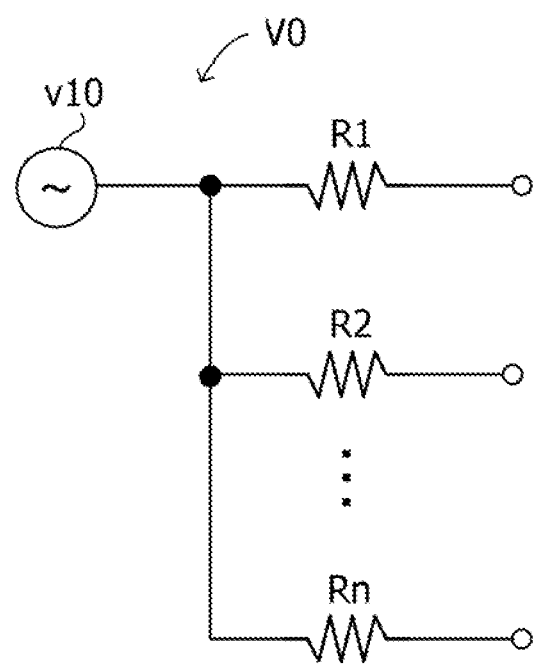
FIG. 18 is a diagram illustrating an example of a configuration of a power supply unit.

FIG. 18 is a diagram illustrating an example of a configuration of the power supply unit. This is an example of a power supply unit V0 including a single AC power supply and a plurality of resistors. The power supply unit V0 includes an AC power supply v10 and resistors R1 to Rn. An output end of the AC power supply v10 is connected to one end of each of the resistors R1 to Rn, and another ends of each of the resistors R1 to Rn serve as input ends of n oscillation circuits. Each resistance value of each of the resistors R1 to Rn is different.

In this way, a configuration is used in which the AC power supply v10 that outputs a sine wave signal of an AC voltage is shared and a plurality of resistor elements having different resistance values branch and output the sine wave signal. As a result, it is possible to apply the AC voltages having the amplitudes different from each other to the n oscillation circuits. With such a configuration, it is possible to generate sine wave waveforms having the same period and different amplitudes as input signals with a circuit configuration having a smaller number of components.

Note that, in the above, it has been described that the characteristics of the tunnel diodes and the inductors in the oscillation circuits are set to be the same so as to vary the burst pulse waveform based on a fluctuation in an output voltage from the power supply unit. However, the characteristics of the tunnel diodes and the inductors may be changed for each oscillation circuit.

For example, by using an inductor having an inductance different for each oscillation circuit, it is possible to change a basic frequency of the burst pulse (frequency of intermittent pulse, frequency of short pulse) and to oscillate various burst pulses.

Furthermore, by using such an oscillation circuit, for example, for reservoir computing (reservoir computing) to be described later that is one of architectures of a recursive neural network, it is possible to improve a performance of reservoir computing.

Third Embodiment

Next, a third embodiment will be described. In the third embodiment, a feedback loop is provided in an oscillation circuit.

Figure 19:
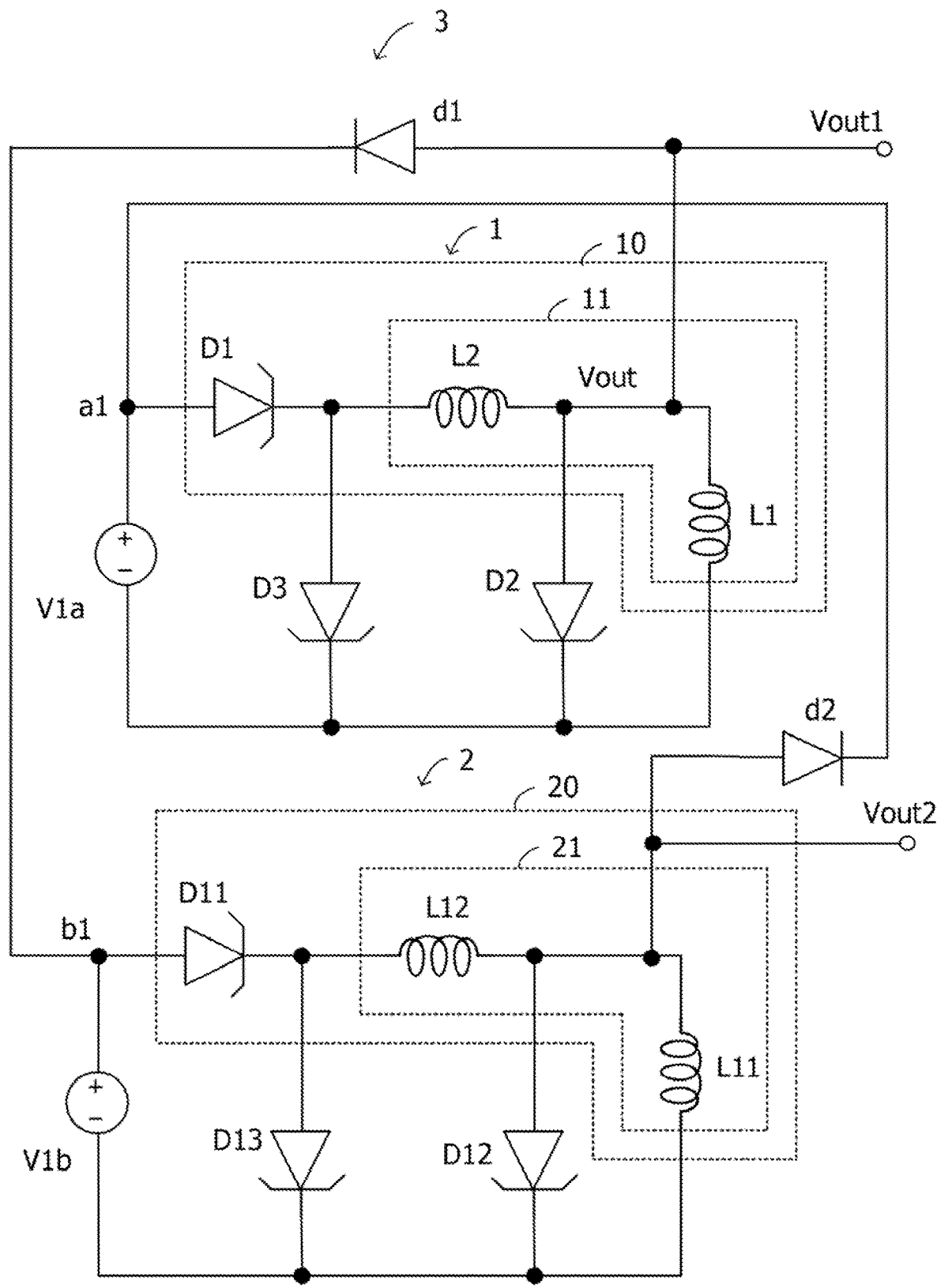
FIG. 19 is a diagram illustrating an example of a configuration of an oscillation circuit including a feedback loop.

FIG. 19 is a diagram illustrating an example of a configuration of the oscillation circuit including the feedback loop. An oscillation circuit 3 is a circuit that includes an oscillation circuit 1 (first oscillation circuit) and an oscillation circuit 2 (second oscillation circuit) and includes a feedback loop that uses an output signal of the oscillation circuit 1 as an input of the oscillation circuit 2 and an output signal of the oscillation circuit 2 as an input of the oscillation circuit 1.

The oscillation circuit 1 includes a tunnel diode D1 (first diode), a tunnel diode D2 (second diode), a tunnel diode D3 (third diode), an inductor L1 (first inductor), an inductor L2 (second inductor), a power supply unit V1a (first power supply unit), and a rectification diode d1 (first rectification diode).

Furthermore, in the oscillation circuit 1, the tunnel diode D1 and a composite inductor 11 (first composite inductor) are connected in series so as to form an oscillation unit 10 (first oscillation unit). The composite inductor 11 is a composite series inductor that includes the inductors L1 and L2 connected in series.

The oscillation circuit 2 includes a tunnel diode D11 (fourth diode), a tunnel diode D12 (fifth diode), a tunnel diode D13 (sixth diode), an inductor L11 (third inductor), an inductor L12 (fourth inductor), a power supply unit V1b (second power supply unit), and a rectification diode d2 (second rectification diode).

In the oscillation circuit 2, the tunnel diode D11 and a composite inductor 21 (second composite inductor) are connected in series so as to form an oscillation unit 20 (second oscillation unit). The composite inductor 21 is a composite series inductor that includes the inductors L11 and L12 connected in series.

Here, in the oscillation circuit 3, the normal rectification diodes d1 and d2 are provided, in order to prevent a power supply voltage component from flowing backward due to the feedback loop. Furthermore, each of the oscillation circuits 1 and 2 in the oscillation circuit 3 is a floating circuit (non-grounded circuit) and has a configuration in which interaction is taken only by the feedback loop.

Moreover, a feedback loop (first feedback loop) is formed in which an input end a1 (first input end) of the oscillation circuit 1 is connected to an output end Vout2 (second output end) of the oscillation circuit 2. Furthermore, a feedback loop (second feedback loop) is formed in which an input end b1 (second input end) of the oscillation circuit 2 is connected to an output end Vout1 (first output end) of the oscillation circuit 1.

In a connection relationship of the components, a positive-side terminal (first output terminal) of the power supply unit V1a is connected to an anode of the tunnel diode D1 and a cathode of the rectification diode d2. A cathode of the tunnel diode D1 is connected to an anode of the tunnel diode D3 and one end of the inductor L2.

Another end of the inductor L2 is connected to an anode of the tunnel diode D2, an anode of the rectification diode d1, the output end Vout1, and one end of the inductor L1. A negative-side terminal (second output terminal) of the power supply unit V1a is connected to another end of the inductor L1, a cathode of the tunnel diode D2, and a cathode of the tunnel diode D3.

On the other hand, a positive-side terminal (third output terminal) of the power supply unit V1b is connected to an anode of the tunnel diode D11 and a cathode of the rectification diode d1. A cathode of the tunnel diode D11 is connected to an anode of the tunnel diode D13 and one end of the inductor L12.

Another end of the inductor L12 is connected to an anode of the tunnel diode D12, an anode of the rectification diode d2, the output end Vout2, and one end of the inductor L11. A negative-side terminal (fourth output terminal) of the power supply unit V1b is connected to another end of the inductor L11, a cathode of the tunnel diode D12, and a cathode of the tunnel diode D13.

Figure 20:
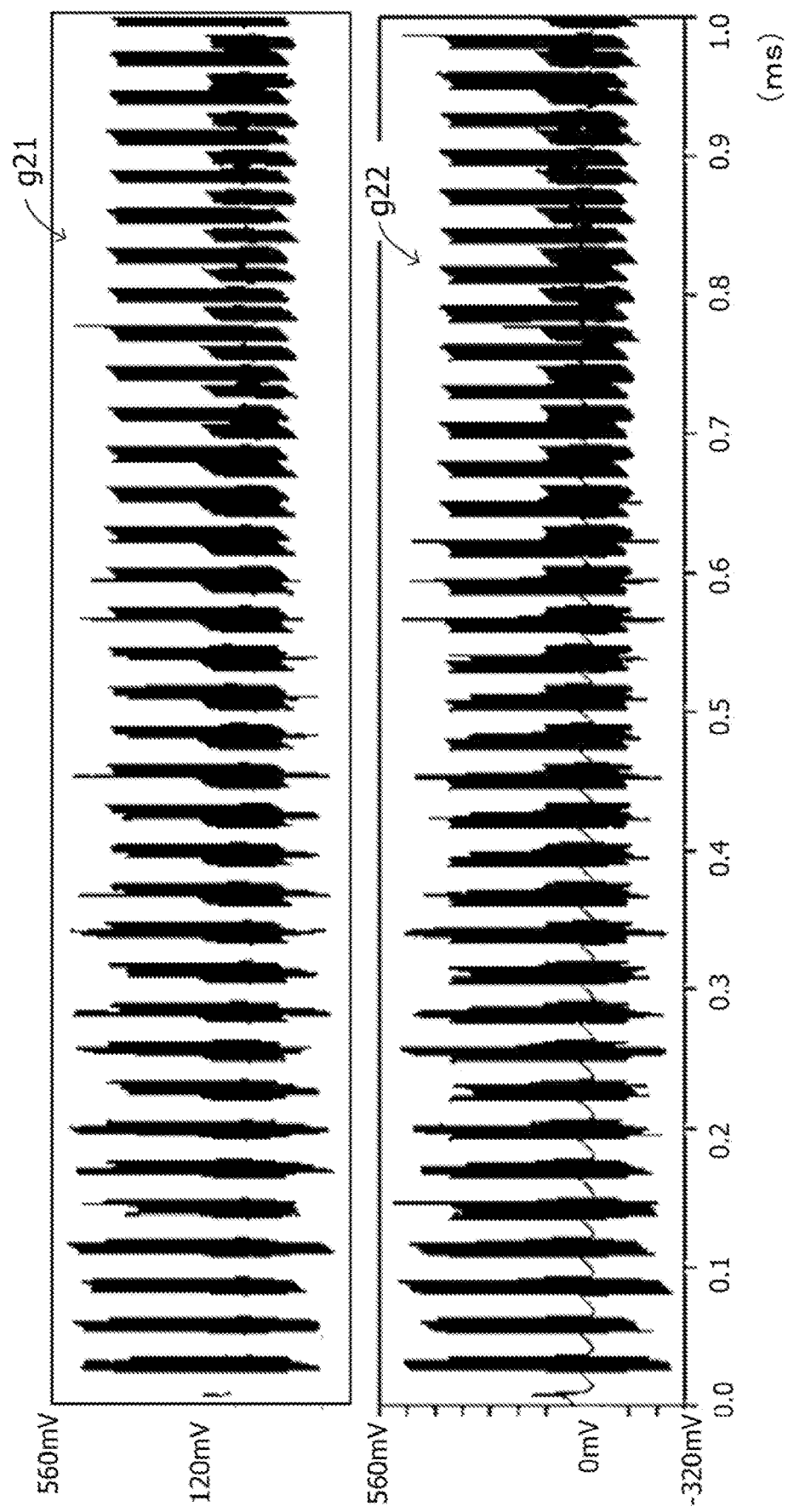
FIG. 20 is a diagram illustrating an example of the waveform of the burst pulse.

FIG. 20 is a diagram illustrating an example of the waveform of the burst pulse. The vertical axis indicates a voltage (mV), and the horizontal axis indicates time (ms). A graph g21 illustrates a waveform of a burst pulse output from the output end Vout1, and a graph g22 illustrates a waveform of a burst pulse output from the output end Vout2.

In this way, by providing the feedback loops in the two oscillation circuits 1 and 2, the oscillation circuit 3 can generate complex and diverse burst pulse waveforms. Note that, in the above, a configuration has been described in which the two oscillation circuits are connected to each other. However, more oscillation circuits may be used. In that case, by unbalancing the number of interconnections, it is possible to generate more complex and diverse burst pulses.

Fourth Embodiment

Figure 21:
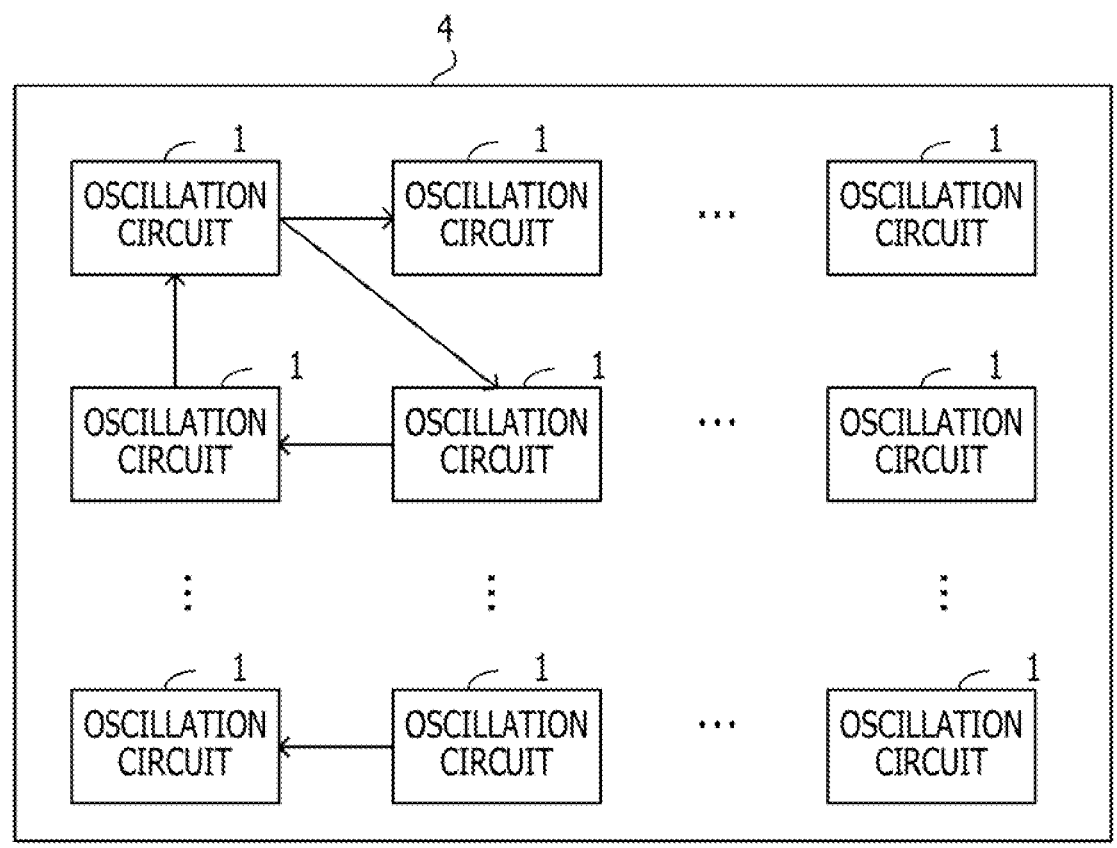
FIG. 21 is a diagram illustrating an example of a reservoir circuit.

Next, a fourth embodiment will be described. The fourth embodiment is an information processing device in which an oscillation circuit 1 is applied to reservoir computing. FIG. 21 is a diagram illustrating an example of a reservoir circuit. A reservoir circuit 4 includes the plurality of oscillation circuits 1 and in which the oscillation circuits 1 are arranged in a two-dimensional grid pattern. Furthermore, feedback loops (arrow in figure) of the plurality of oscillation circuits 1 are randomly generated.

In this way, the plurality of oscillation circuits 1 connected to each other with the random feedback loops function as non-linear nodes in the reservoir circuit 4. As a result, a more complex and high-performance reservoir computing function can be realized as compared with a case where one node includes simple non-linear elements (diode, inductor, or the like).

Figure 22:
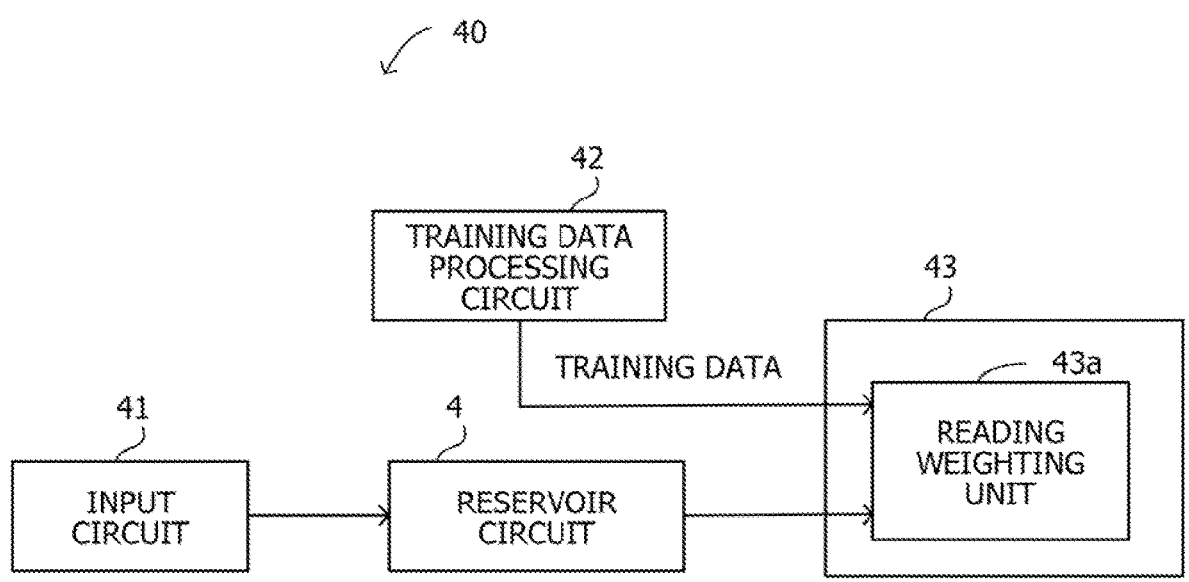
FIG. 22 is a diagram illustrating an example of a reservoir computing device.

FIG. 22 is a diagram illustrating an example of a reservoir computing device. A reservoir computing device 40 includes an input circuit 41, the reservoir circuit 4, a training data processing circuit 42, and an output circuit 43. Furthermore, in the output circuit 43, a reading weighting unit 43a is arranged.

Data is input from the input circuit 41 to the reservoir circuit 4, and the reservoir circuit 4 executes arithmetic processing on the input data. At the time of reservoir training, the reading weighting unit 43a adjusts a weighting value, based on an error between training data (teacher data)

output from the training data processing circuit 42 and the data on which the arithmetic processing has been executed, and the adjusted data is output from the output circuit 43. In this way, by adjusting the weighting based on the error between the output of the reservoir circuit 4 and the training data, it is possible to perform high-speed training in real time.

Fifth Embodiment

Figure 23:
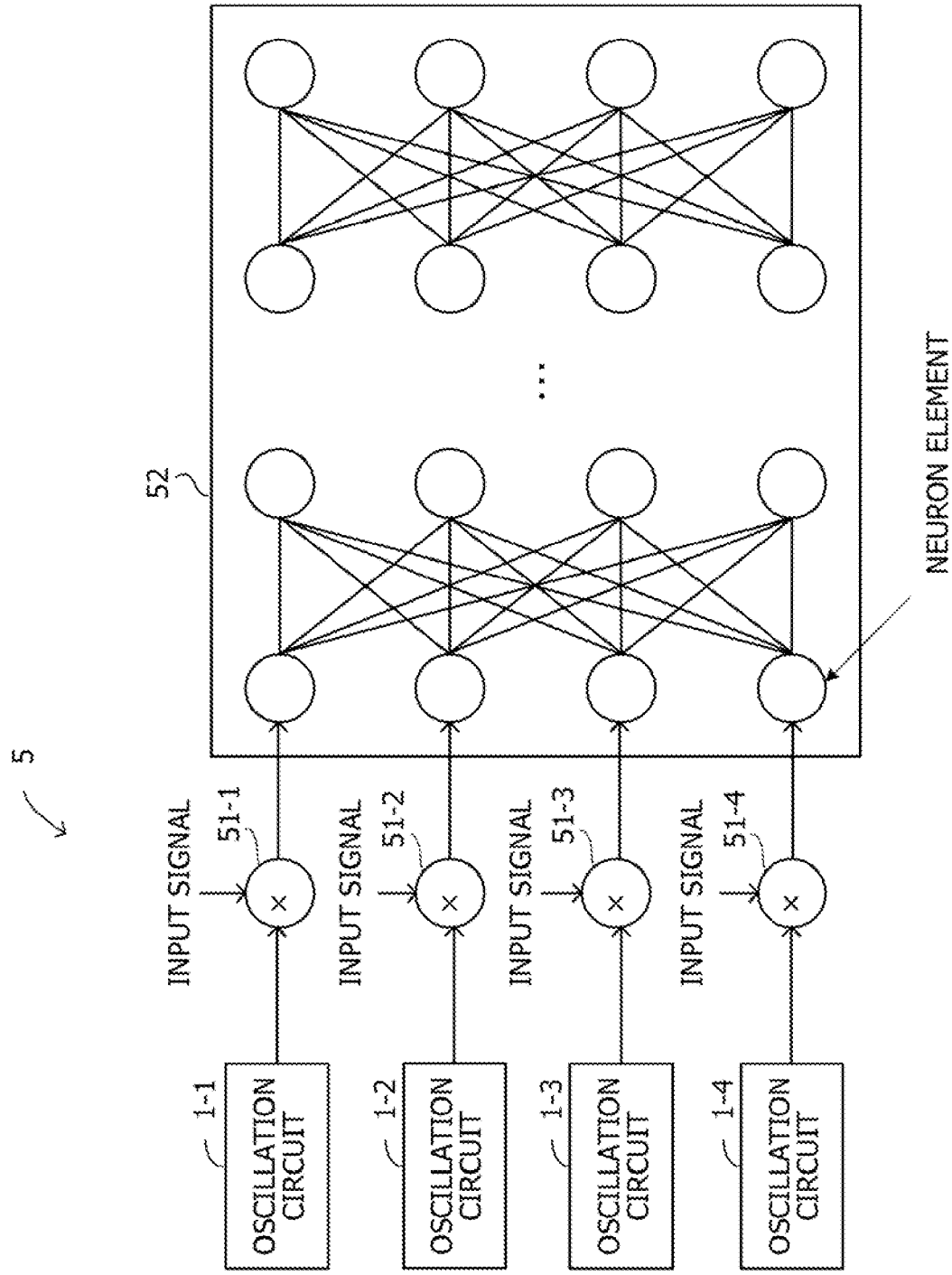
FIG. 23 is a diagram illustrating an example of a spiking neural network system.

A fifth embodiment is an information processing device in which an oscillation circuit 1 is applied to a spiking neural network system. FIG. 23 is a diagram illustrating an example of the spiking neural network system. A spiking neural network system 5 includes oscillation circuits 1-1 to 1-4, encoders 51-1 to 51-4, a neural network unit 52 including a plurality of neuron elements connected like a network.

The oscillation circuits 1-1 to 1-4 oscillate burst pulses. The encoders 51-1 to 51-4 receive burst pulses and input signals, mix the burst pulses and the input signals, generate encoded pulse signals, and output the signals to the neural network unit 52. Note that the encoders 51-1 to 51-4 modulate the input signal based on at least any one of an intensity, a frequency, and an interval of the burst pulse and generate the encoded pulse signals. The neural network unit 52 executes information processing based on the encoded pulse signal.

As described above, according to the oscillation circuit of the present invention, the circuit including the tunnel diode having the negative differential resistance in a predetermined voltage range and the inductor is used as a basic unit so as to oscillate the burst pulse. As a result, it is possible to configure a low-power highly-integrated circuit that has a small number of components and oscillates neuron-like burst pulses.

The embodiments have been exemplified above, and the configuration of each unit described in the embodiments may be replaced with another configuration having a similar function. Furthermore, any other components and steps may be added. Moreover, any two or more configurations (features) of the embodiments described above may be combined.

The above description merely indicates the principle of the present invention. Moreover, numerous modifications and changes can be made by those skilled in the art. The present invention is not limited to the exact configuration and application examples illustrated and described above, and all corresponding modifications and equivalents are regarded within the scope of the present invention by appended claims and equivalents thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An oscillation circuit comprising
a first oscillation circuit that includes:
a first diode that has a first negative differential resistance;
a first composite inductor in which a first inductor and a second inductor are connected in series, is connected to the first diode in series;
a second diode that has a second negative differential resistance and is connected to the first inductor in parallel; and
a third diode that has a third negative differential resistance, is connected to the first diode in series, and is connected to the first composite inductor in parallel, wherein
a burst pulse is output from a common connection point of the first inductor, the second inductor, and the second diode.

2. The oscillation circuit according to claim 1, further comprising
a power supply configured to output a direct-current voltage, an alternating-current voltage, or a voltage in which an alternating-current voltage is superimposed on a direct-current voltage,
wherein a first output terminal of the power supply is connected to an anode of the first diode, a cathode of the first diode is connected to one end of the second inductor and an anode of the third diode, another end of the second inductor is connected to one end of the first inductor and an anode of the second diode, and a second output terminal of the power supply is connected to another end of the first inductor, a cathode of the second diode, and a cathode of the third diode.

3. The oscillation circuit according to claim 1, wherein the first negative differential resistance is larger than the second negative differential resistance and the third negative differential resistance.

4. The oscillation circuit according to claim 1, wherein a first inductance of the first inductor and a second inductance of the second inductor are varied, and a period of an intermittent pulse included in the burst pulse and the number of short pulses to be superimposed on the intermittent pulse are varied.

5. The oscillation circuit according to claim 4, wherein
with respect to a first period of the intermittent pulse included in the burst pulse that is output when the first inductance is equal to the second inductance, and to a first number of pulses of the short pulses,
by setting the first inductance to be smaller than the second inductance, a second period of the intermittent pulse included in the burst pulse that is output when the first inductance is smaller than the second inductance is set to be shorter than the first period, and a second number of pulses of the short pulses included in the burst pulse is decreased to be smaller than the first number of pulses, and
by setting the second inductance to be smaller than the first inductance, a third period of the intermittent pulse included in the burst pulse that is output when the second inductance is smaller than the first inductance is set to be shorter than the first period, and a third number of pulses of the short pulses included in the burst pulse is increased to be larger than the first number of pulses.

6. The oscillation circuit according to claim 1, wherein the second negative differential resistance and non-linear characteristics of the second diode cause a duty ratio of an intermittent pulse included in the burst pulse to be asymmetric.

7. The oscillation circuit according to claim 1, wherein the third negative differential resistance and non-linear characteristics of the third diode vary an intermittent degree of an intermittent pulse included in the burst pulse.

8. The oscillation circuit according to claim 1, wherein an amplitude of the burst pulse is varied according to a size of the first diode.

9. The oscillation circuit according to claim 1, further comprising
a second oscillation circuit that includes:
- a fourth diode that has a fourth negative differential resistance;
- a second composite inductor in which a third inductor and a fourth inductor are connected in series, is connected to the fourth diode in series;
- a fifth diode that has a fifth negative differential resistance and is connected to the third inductor in parallel; and
- a sixth diode that has a sixth negative differential resistance, is connected to the fourth diode in series, and is connected to the second composite inductor in parallel, wherein a first feedback loop in which a first input end of the first oscillation circuit is connected to a second output end of the second oscillation circuit and a second feedback loop in which a second input end of the second oscillation circuit is connected to a first output end of the first oscillation circuit are formed, a first burst pulse is output from the first output end that is a common connection point of the first inductor, the second inductor, and the second diode, and a second burst pulse is output from the second output end that is a common connection point of the third inductor, the fourth inductor, and the fifth diode.

10. The oscillation circuit according to claim 9, wherein
the first oscillation circuit further includes a first power supply that outputs a direct-current voltage, an alternating-current voltage, or a voltage in which an alternating-current voltage is superimposed on a direct-current voltage, and a first rectification diode, the second oscillation circuit further includes a second power supply that outputs a direct-current voltage, an alternating-current voltage, or a voltage in which an alternating-current voltage is superimposed on a direct-current voltage, and a second rectification diode, a first output terminal of the first power supply is connected to an anode of the first diode and a cathode of the second rectification diode, a cathode of the first diode is connected to an anode of the third diode and one end of the second inductor, another end of the second inductor is connected to an anode of the second diode, an anode of the first rectification diode, the first output end, and one end of the first inductor, and a second output terminal of the first power supply is connected to another end of the first inductor, a cathode of the second diode, and a cathode of the third diode, and a third output terminal of the second power supply is connected to an anode of the fourth diode and a cathode of the first rectification diode, a cathode of the fourth diode is connected to an anode of the sixth diode and one end of the fourth inductor, another end of the fourth inductor is connected to an anode of the fifth diode, an anode of the second rectification diode, the second output end, and one end of the third inductor, and a fourth output terminal of the second power supply is connected to another end of the third inductor, a cathode of the fifth diode, and a cathode of the sixth diode.

11. An information processing device comprising:
a reservoir circuit in which a plurality of oscillation circuits is arranged, wherein each of the plurality of oscillation circuits includes an oscillation circuit that includes:
a first diode that has a first negative differential resistance;
a first composite inductor in which a first inductor and a second inductor are connected in series, is connected to the first diode in series;
a second diode that has a second negative differential resistance and is connected to the first inductor in parallel; and
a third diode that has a third negative differential resistance, is connected to the first diode in series, and is connected to the first composite inductor in parallel, and
outputs a burst pulse from a common connection point of the first inductor, the second inductor, and the second diode,
wherein each of the plurality of oscillation circuits is connected to any one of the plurality of oscillation circuits.

12. An information processing device comprising:
an oscillation circuit that includes: a first diode that has a first negative differential resistance; a first composite inductor in which a first inductor and a second inductor are connected in series, is connected to the first diode in series; a second diode that has a second negative differential resistance and is connected to the first inductor in parallel; and a third diode that has a third negative differential resistance, is connected to the first diode in series, and is connected to the first composite inductor in parallel, and that is configured to output a burst pulse from a common connection point of the first inductor, the second inductor, and the second diode;
an encoder configured to generate an encoded pulse signal, based on the burst pulse output from the oscillation circuit and an input signal; and
a neural network that includes a plurality of neuron elements and is configured to execute information processing on the encoded pulse signal.

* * * * *